(12) United States Patent
Kwon

(10) Patent No.: US 8,319,425 B2
(45) Date of Patent: Nov. 27, 2012

(54) ORGANIC LIGHT EMITTING DISPLAY DEVICE HAVING RFID

(75) Inventor: Kee-Won Kwon, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 378 days.

(21) Appl. No.: 12/656,441

(22) Filed: Jan. 29, 2010

(65) Prior Publication Data

US 2010/0207506 A1 Aug. 19, 2010

(30) Foreign Application Priority Data

Feb. 16, 2009 (KR) .................. 10-2009-0012309

(51) Int. Cl.
  *H01L 51/50* (2006.01)
  *H01L 51/52* (2006.01)
  *H01L 51/54* (2006.01)

(52) U.S. Cl. .............. 313/512; 313/504; 340/12.51

(58) Field of Classification Search ............ 340/571, 340/572.1, 572.4, 572.7, 572.8, 539.1, 539.13, 340/10.1, 10.31, 10.51, 7.5, 5.81, 12.51, 340/13.26; 345/80, 87, 92; 313/498–512
See application file for complete search history.

(56) References Cited

U.S. PATENT DOCUMENTS

| | | | |
|---|---|---|---|
| 7,260,882 B2* | 8/2007 | Credelle et al. ............ 29/600 |
| 7,713,800 B2* | 5/2010 | Kusumoto et al. ............ 438/151 |
| 2003/0214792 A1* | 11/2003 | Credelle et al. ............ 361/760 |
| 2005/0079820 A1 | 4/2005 | Yamashita |
| 2006/0110580 A1* | 5/2006 | Aylward et al. ............ 428/172 |
| 2006/0146271 A1 | 7/2006 | Pennaz et al. |
| 2006/0284553 A1* | 12/2006 | Levarlet et al. ............ 313/506 |
| 2007/0296592 A1* | 12/2007 | Huang et al. ............ 340/572.7 |
| 2008/0239644 A1* | 10/2008 | Cassidy et al. ............ 361/681 |

FOREIGN PATENT DOCUMENTS

| | | |
|---|---|---|
| JP | 2005-018671 A | 1/2005 |
| JP | 2005-062628 A | 3/2005 |
| JP | 2005-117354 A | 4/2005 |
| JP | 2005-157988 A | 6/2005 |
| KR | 10-2005-0088945 A | 9/2005 |
| KR | 10 2009-0034408 A | 4/2009 |

OTHER PUBLICATIONS

Machine translation of Kobashi JP 2005-062628 A.*

* cited by examiner

*Primary Examiner* — Anne Hines
*Assistant Examiner* — Jose M Diaz
(74) *Attorney, Agent, or Firm* — Lee & Morse, P.C.

(57) ABSTRACT

An organic light emitting display device having RFID includes a substrate including a pixel region having at least one organic light emitting device and a non-pixel region formed on the outer circumference of the pixel region, a sealing substrate that seals at least the pixel region of the substrate, an RFID antenna pattern on the sealing substrate, and an RFID chip electrically coupled to the RFID antenna pattern.

12 Claims, 2 Drawing Sheets

ORGANIC LIGHT EMITTING DISPLAY DEVICE HAVING RFID

BACKGROUND

1. Field

Embodiments relate to an organic light emitting display device. More particularly, embodiments relate to an organic light emitting display device having radio frequency identification (RFID) in which an RFID antenna is on a sealing substrate.

2. Description of the Related Art

Flat panel display devices include a liquid crystal display (LCD) device, a field emission display (FED) device, a plasma display panel (PDP), an organic light emitting diode (OLED) display device, etc. Flat panel display devices are used both to replace a cathode ray tube (CRT) display device and as a light weight, small displays, e.g., in lap-top computers, mobile communication devices, and so forth.

Among flat panel display devices, OLED display devices, which display an image using organic light emitting diodes that emits light by re-combination of electrons and holes, has numerous advantages including rapid response speed and low power consumption. Since OLEDs are self-emitting devices, OLED display devices do not need a backlight unit. In contrast, LCDs require a backlight unit, increasing the size thereof Elimination of such a backlight unit allows OLED display devices to be considerably thin.

SUMMARY

Embodiments are directed to an organic light emitting display device having RFID.

It is a feature of an embodiment to provide an organic light emitting display device having an RFID antenna on a sealing substrate thereof.

It is another feature of an embodiment to provide an organic light emitting display device having a small form factor.

At least one of the above and other features and advantages may be realized by providing an organic light emitting display device having RFID, including a substrate including a pixel region having at least one organic light emitting device and a non-pixel region on a periphery of the substrate outside the pixel region, a sealing substrate that seals at least the pixel region of the substrate, an RFID antenna pattern on the sealing substrate, and an RFID chip electrically coupled to the RFID antenna pattern.

The RFID antenna pattern may be made of a transparent conductive material. The sealing substrate may be a glass substrate made of a transparent material.

The RFID chip may be on the sealing substrate. The RFID chip may overlie the non-pixel region of the substrate.

The RFID chip may be on the non-pixel region of the substrate. The sealing substrate may seal the RFID chip. The organic light emitting display device may include a conductive line through the sealing substrate to electrically couple the RFID antenna to the RFID chip.

The RFID antenna pattern may overlie the pixel region of the substrate.

The organic light emitting display device may include a sealant between the sealing substrate and the substrate. The organic light emitting display device having may include a reinforcing member between the sealing substrate and the substrate, and adjacent an outer surface of the sealant. The RFID chip may be on the non-pixel region of the substrate and adjacent an inner surface of the sealant.

The organic light emitting display device may have a card form factor.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
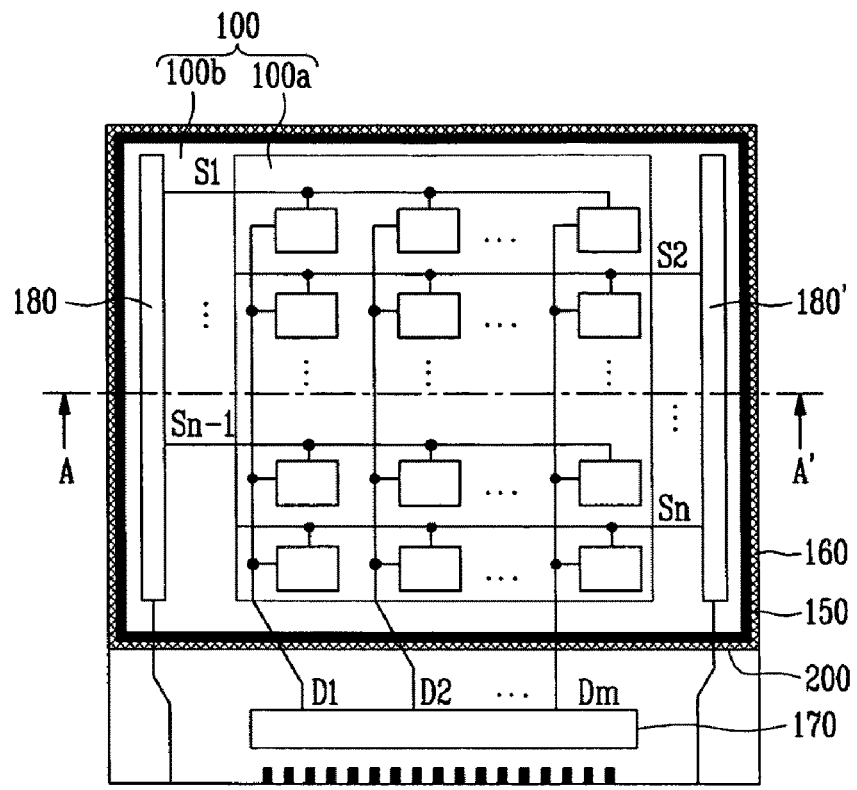
FIG. 1 illustrates a block diagram of a configuration of an organic light emitting display device according to an embodiment.

Korean Patent Application No. 10-2009-0012309, filed on Feb. 16, 2009, in the Korean Intellectual Property Office, and entitled: "Organic Light Emitting Display Device Having RFID," is incorporated by reference herein in its entirety.

In the following detailed description, only certain exemplary embodiments of the present invention have been shown and described, simply by way of illustration. As those skilled in the art would realize, the described embodiments may be modified in various different ways, all without departing from the spirit or scope of embodiments. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

Hereinafter, exemplary embodiments of the present invention will be described with reference to the accompanying drawings.

Figure 2:
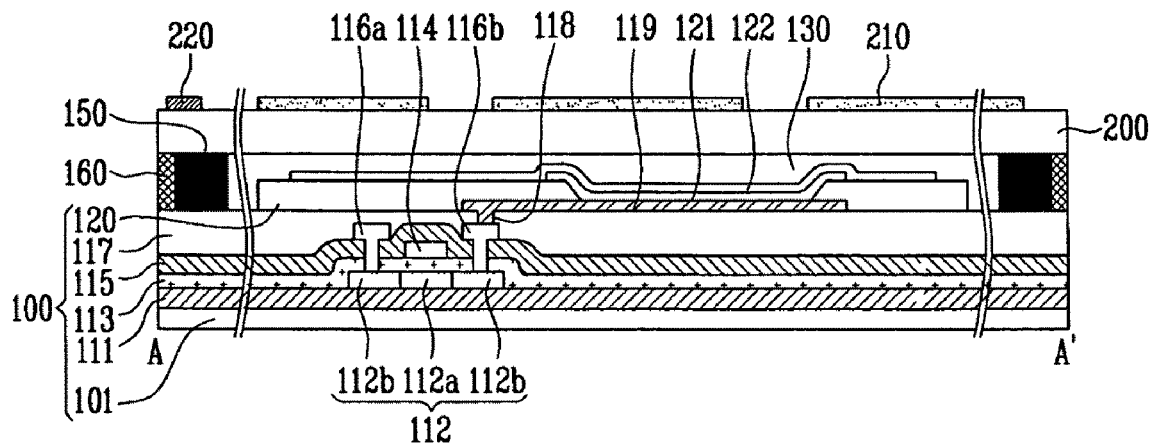
FIG. 2 illustrates a cross-sectional view of a specific region A-A' of FIG. 1 according to an embodiment.

FIG. 1 illustrates a block diagram of a configuration of an organic light emitting display device according to an embodiment. FIG. 2 illustrates a cross-sectional view of a specific region A-A' of FIG. 1.

Referring to FIGS. 1 and 2, the organic light emitting display device may include a substrate 100, a sealing substrate 200, a sealant 150, and a reinforcing material 160. For convenience of explanation, it will be understood that the substrate 100 refers to a substrate including an organic light emitting device and a deposition substrate 101 refers to a substrate that is a base substrate on which the organic light emitting device is formed, respectively. The organic light emitting device may include a first electrode 119, an organic light emitting layer 121, and a second electrode 122.

The substrate 100 may be a plate including the organic light emitting device and may include a pixel region 100a where at least one organic light emitting device is formed and a non-pixel region 100b formed on an outer circumference of the pixel region 100a. Hereinafter, the pixel region 100a is to be considered a region on which a predetermined image is displayed due to light emitted from the organic light emitting device and the non-pixel region 100b is to be considered a region other than the pixel region 100a on the substrate 100.

The pixel region 100a may include a plurality of scan lines S1 to Sn arranged in a row direction and a plurality of data lines D1 to Dm arranged in a column direction. A plurality of pixels that receives signals from a driver IC that drives the organic light emitting device may be formed at intersections of the scan lines S1 to Sn and the data lines D1 to Dm.

The non-pixel region 100b may include a driver IC that drives the organic light emitting device and metal wires that are electrically coupled to the scan lines S1 to Sn and the data lines D1 to Dm in the pixel region, respectively. In the present embodiment, the driver IC may include a data driver 170 and scan drivers 180 and 180'.

The pixel including the organic light emitting device may be driven as an active matrix type. Details of the structure of the pixel will be briefly described with reference to FIG. 2.

A buffer layer 111 may be formed on the deposition substrate 101 in order to prevent the support substrate 101 from being damaged due to external factors, e.g., heat, humidity, etc. The buffer layer 111 may be made of an insulating material, e.g., silicon oxide ($SiO_2$), silicon nitride ($SiN_x$), and so forth.

A semiconductor layer 112 that includes an active layer 112a and an ohmic contact layer 112b may be formed on at least any one region of the buffer layer 111. A gate insulating layer 113 may be formed on the semiconductor layer 112 and the buffer layer 111. A gate electrode 114 having a width determined in accordance with a width of the active layer 112a may be formed on one region of the gate insulating layer 113, e.g., overlying the active layer 112a.

An interlayer insulating layer 115 may be formed on the gate insulating layer 113, including the gate electrode 114. Source and drain electrodes 116a and 116b may be formed on and through a predetermined region of the interlayer insulating layer 115.

The source and drain electrodes 116a and 116b may be connected to exposed regions of the ohmic contact layer 112b, respectively. A planarization layer 117 may be formed on the interlayer insulating layer 115, including the source and drain electrodes 116a and 116b. The first electrode 119 may be formed on one region of the planarization layer 117 and may be coupled to any one of exposed regions of the source and drain electrodes 116a and 116b by a via hole 118 through the planarization layer 117.

A pixel definition layer 120 provided with an opening portion that exposes at least one region of the first electrode 119 may be formed on the planarization layer 117, including the first electrode 119. An organic layer 121 may be formed on the opening portion of the pixel definition layer 120 and a second electrode layer 122 may be formed on the pixel definition layer 120, including the organic layer 121. A passivation layer 130 may further be formed on the second electrode layer 122.

The organic layer 121 may be provided between the first electrode 119 and the second electrode layer 122 and may include an organic light emitting layer where holes supplied from an anode and electrons supplied from a cathode are combined to form excitons, i.e., electron-hole pairs, the organic light emitting layer emitting light by energy generated as the excitons return to a bottom state. Here, the generated excitons form singlet excitons or triplet excitons according to a spin combination shape, wherein a probability to form singlet excitons is 1/4 and a probability to form triplet excitons is 3/4.

In general, a base state of an organic molecule is a singlet state. Single excitons transition to the base state while emitting light, which referred to as fluorescence, and a fluorescent organic light emitting device adopts such an organic molecule.

However, triplet excitons are not allowed to transition to the base state, i.e., the singlet state, while emitting light, so that 75% excitons are wasted. Therefore, a phosphorescent dopant having great spin-orbit coupling is used in a light emitting layer so that an organic molecule is capable of transitioning from the triplet state to the base state while emitting light, which is referred to as phosphorescence. A phosphorescent organic light emitting device employs such an organic molecule.

An organic light emitting display panel according to embodiments may adopt any of fluorescent and phosphorescent organic light emitting devices.

The sealing substrate 200, which is a member that seals at least the pixel region 100a on which the organic light emitting device is formed, may be bonded to the substrate 100 by means of the sealant 150. Also, the reinforcing material 160, which is formed on the lateral part of the sealant 150, i.e., on a periphery of the substrate 100 outside the sealant 160, may function as a sealing material in case the sealant 150 is deliquesced, such that the sealant 150 is no longer adhered or is only weakly adhered.

When the display device is a top-emission type or a dual-emission type, the sealing substrate 200 is made of a transparent material. When the display device is bottom-emission, the sealing substrate 200 may be made of an opaque material. In embodiments, the material of the sealing substrate 200 is not limited. However, if the display device according to embodiments is to be the top or dual emitting, glass may be used as an illustrative example of a transparent material.

The organic light emitting display device in the embodiment explained with reference to FIGS. 1 and 2 displays an image using self-luminescent OLED devices, so a backlight unit is not needed. Thus, the light emitting display device may be made considerably thin, e.g., in a card shape.

Also, in the present embodiment, an RFID antenna pattern 210 may be formed on the sealing substrate 200. As illustrated in FIG. 2, the RFID antenna pattern may overlie the pixel region 100a of the substrate 100. When the sealing substrate 200 is transparent, e.g., a glass substrate, the antenna pattern 210 may be made of a transparent conductive material, e.g., indium tin oxide (ITO), indium zinc oxide (IZO), and so forth.

Figure 3:
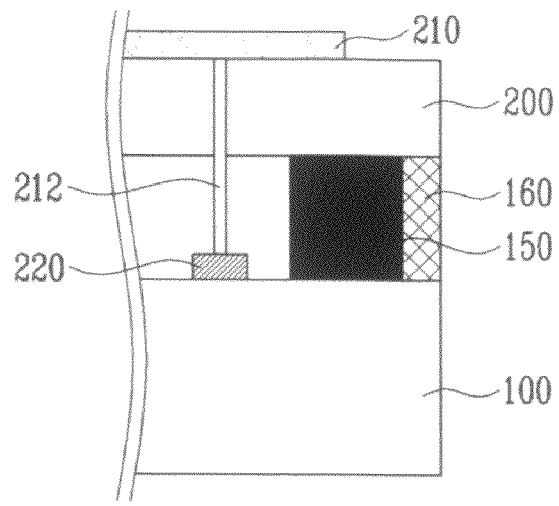
FIG. 3 illustrates a cross-sectional view according to an embodiment.

As illustrated in FIG. 2, an RFID chip 220 electrically coupled to one side of the antenna pattern 210 may be formed on the sealing substrate 200, and may overlie the non-display region 100b of the substrate 100, e.g., may overlie the sealant 150 and/or the reinforcing member 160. Alternatively, as illustrated in FIG. 3, the RFID chip 220 may be in a non-display region 100b of the substrate 100 and electrically coupled to the one end of the RFID antenna pattern 210 through a conductive line 212.

In accordance with the above embodiments, the RFID function may be implemented in the organic light emitting display device, allowing the organic light emitting display device may serve multiple functions in addition to display. When the organic light emitting display device has a card form factor, the organic light emitting display device may serve as a smart, e.g., a credit card, a traffic card, etc., or as a component of a larger device, e.g., a cellular telephone, a personal digital assistance, etc.

Figure 4:
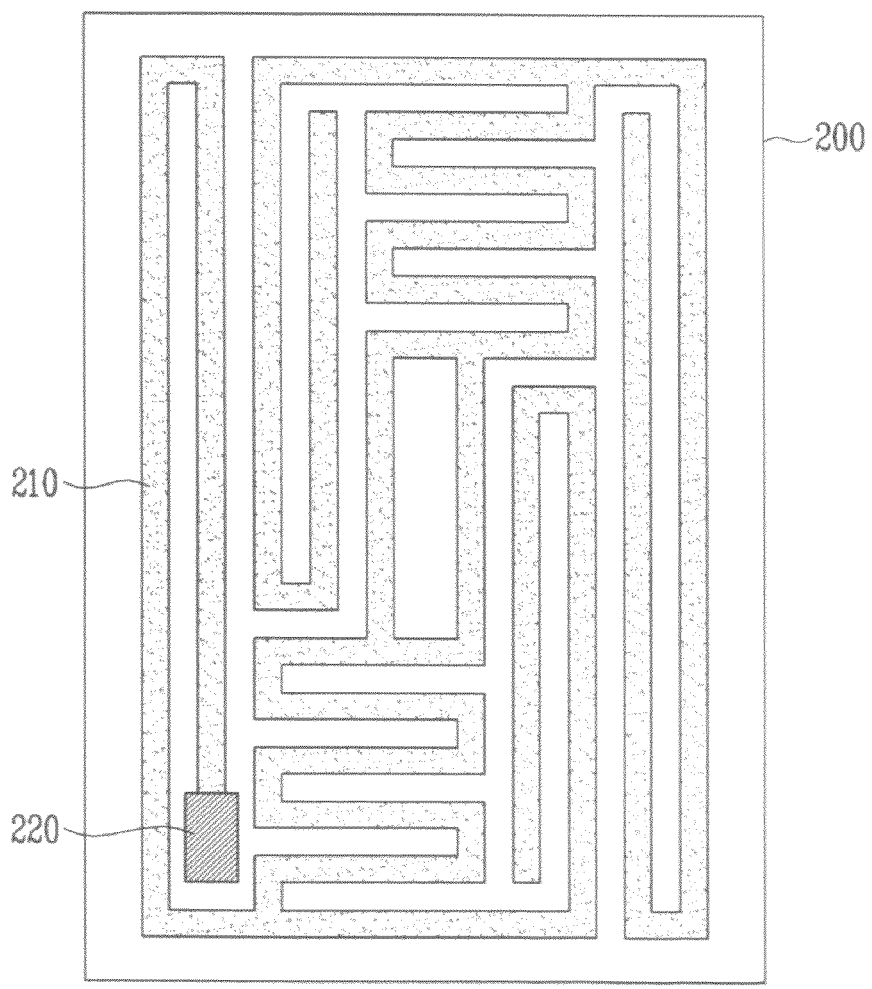
FIG. 4 illustrates a plan view of a surface of a sealing substrate of the organic light emitting display device according to an embodiment.

A specific example of the RFID antenna pattern 210 is illustrated in FIG. 4. FIG. 4 illustrates a plan view of a front surface of the sealing substrate 200 of the organic light emitting display device according to the embodiment of the present invention.

Referring to FIG. 4, the RFID antenna pattern 210 may be formed on the front surface of the sealing substrate 200 of the organic light emitting display device. The shape of the RFID antenna pattern 210 shown in FIG. 4 is merely one embodiment. However, the RFID antenna pattern 210 may be implemented in various patterns.

The RFID antenna pattern 210 may be made of a transparent conductive material such as ITO or IZO. Accordingly, light emitted from the organic light emitting display device may be transmitted through the RFID pattern to be displayed even if the organic light emitting display device a top-emission type or a dual emission type.

The RFID chip 220 may be electrically coupled to an end of one side of the RFID antenna pattern 210. The RFID chip 220 may be formed on the upper surface of the sealing substrate 200 in the embodiment of FIG. 2, but, as illustrated in FIG. 3, the RFID chip 220 may also be formed on the substrate 100 of the organic light emitting display device. When the RFID chip 220 is formed on the substrate 100, the RFID chip 220 may be formed on the non-display region 100b and a separate coupling part, e.g., the coupling line 212, may additionally be provided to be electrically coupled to the RFID antenna pattern 210 formed on the upper surface of the sealing substrate 200. As illustrated in FIG. 3, the RFID chip 220 may be on the non-display region 100b, but within the sealant 150 and the reinforcing material 160, thereby further protecting the RFID chip 220.

The RFID chip 220 may include a microprocessor and a memory and may store various data. Representative data stored in the RFID chip includes a serial number, a service code, personal information, an authentication algorithm parameter, an authentication key, an encryption algorithm, an encryption key, a region identification, a personal identification number (PIN), etc.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display device having radio frequency identification (RFID), comprising:
    a substrate including a pixel region having at least one organic light emitting device and a non-pixel region on a periphery of the substrate outside the pixel region;
    a sealing substrate that seals at least the pixel region of the substrate;
    an RFID antenna pattern on the sealing substrate, wherein the RFID antenna pattern is made of a transparent conductive material; and
    an RFID chip electrically coupled to the RFID antenna pattern.

2. The organic light emitting display device having the RFID as claimed in claim 1, wherein the sealing substrate is a glass substrate made of a transparent material.

3. The organic light emitting display device having the RFID as claimed in claim 1, wherein the RFID chip is on the sealing substrate.

4. The organic light emitting display device having the RFID as claimed in claim 3, wherein the RFID chip overlies the non-pixel region of the substrate.

5. The organic light emitting display device having the RFID as claimed in claim 1, wherein the RFID chip is on the non-pixel region of the substrate.

6. The organic light emitting display device having the RFID as claimed in claim 5, wherein the sealing substrate seals the RFID chip.

7. The organic light emitting display device having the RFID as claimed in claim 5, further comprising a conductive line through the sealing substrate to electrically couple the RFID antenna to the RFID chip.

8. The organic light emitting display device having the RFID as claimed in claim 1, wherein the RFID antenna pattern overlies the pixel region of the substrate.

9. The organic light emitting display device having the RFID as claimed in claim 1, further comprising a sealant between the sealing substrate and the substrate.

10. The organic light emitting display device having the RFID as claimed in claim 9, further comprising a reinforcing member between the sealing substrate and the substrate, and adjacent an outer surface of the sealant.

11. The organic light emitting display device having the RFID as claimed in claim 9, wherein the RFID chip is on the non-pixel region of the substrate and adjacent an inner surface of the sealant.

12. The organic light emitting display device having the RFID as claimed in claim 1, wherein the organic light emitting display device has a card form factor.

* * * * *